United States Patent
Aoki et al.

(10) Patent No.: US 7,037,627 B2
(45) Date of Patent: May 2, 2006

(54) PHOTOMASK DEFECT TESTING METHOD, PHOTOMASK MANUFACTURING METHOD AND SEMICONDUCTOR INTEGRATED CIRCUIT MANUFACTURING METHOD

(75) Inventors: Eiji Aoki, Yamatokooriyama (JP); Shinji Kobayashi, Nara (JP); Toshiyuki Marumo, Asaka (JP); Shinji Akima, Asaka (JP)

(73) Assignees: Sharp Kabushiki Kaisha, Osaka (JP); Toppan Printing Co., Ltd., Tokyo (JP)

( * ) Notice: Subject to any disclaimer, the term of this patent is extended or adjusted under 35 U.S.C. 154(b) by 135 days.

(21) Appl. No.: 10/689,666

(22) Filed: Oct. 22, 2003

(65) Prior Publication Data

US 2004/0086791 A1    May 6, 2004

(30) Foreign Application Priority Data

Oct. 25, 2002    (JP) .............................. 2002-311920

(51) Int. Cl.
*G01F 9/00*    (2006.01)
(52) U.S. Cl. ........................................................ 430/5
(58) Field of Classification Search .................... 430/5; 716/19–21; 250/221; 700/121
See application file for complete search history.

(56) References Cited

U.S. PATENT DOCUMENTS 6,370,441 B1 *    4/2002    Ohnuma ...................... 700/121
2002/0043615 A1 *    4/2002    Tounai et al. ............... 250/221

FOREIGN PATENT DOCUMENTS

JP    2001-272770    10/2001

* cited by examiner

*Primary Examiner*—S. Rosasco
(74) *Attorney, Agent, or Firm*—Nixon & Vanderhye P.C.

(57) ABSTRACT

The present invention provides a photomask defect testing method, a photomask manufacturing method and a semiconductor integrated circuit manufacturing method. In the photomask defect testing method, reference data is created from corrected photomask design data that is corrected on the basis of an exposure transfer pattern, and sensor data is created by measuring the shape of the photomask based on the corrected photomask design data. Furthermore, first non-testing region data indicating non-testing regions including pattern portions having a predetermined width or less and pattern spaces having a predetermined value or less is extracted from the corrected photomask design data, the extracted first non-testing region data is stored so as to be included in the corrected photomask design data, the non-testing regions indicated by the first non-testing region data is excluded, and the reference data is compared with the sensor data, whereby defects on the photomask are detected.

9 Claims, 14 Drawing Sheets

FIG. 10A
PRIOR ART
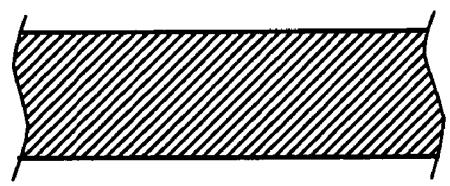
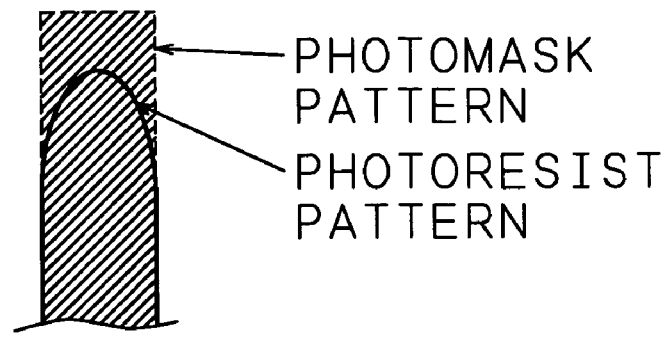
FIG. 10B
PRIOR ART
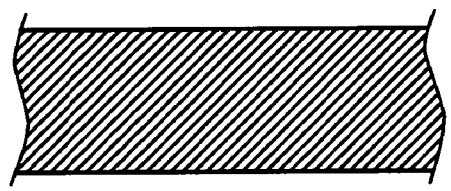
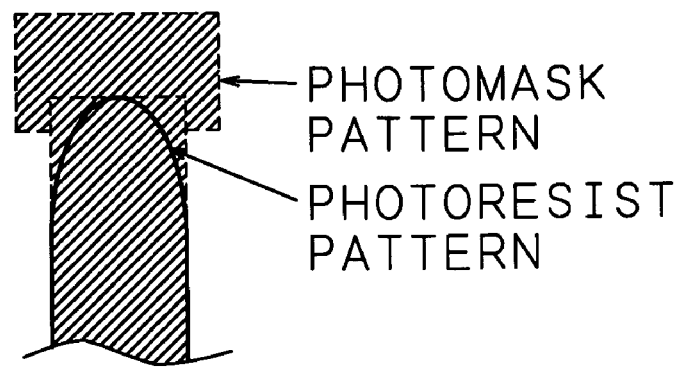

PHOTOMASK DEFECT TESTING METHOD, PHOTOMASK MANUFACTURING METHOD AND SEMICONDUCTOR INTEGRATED CIRCUIT MANUFACTURING METHOD

BACKGROUND OF THE INVENTION

The present invention relates to a photomask defect testing method of creating exposure-use photomask design data corrected with respect to an optical proximity effect at the time of exposure, to a photomask manufacturing method of manufacturing photomasks tested by this photomask defect testing method, and to a semiconductor integrated circuit manufacturing method of manufacturing semiconductor integrated circuits using the photomasks manufactured by this photomask manufacturing method.

DESCRIPTION OF THE RELATED ART

In a semiconductor device manufacturing process, a photolithography process, wherein a layout pattern made according to design data is formed on a photomask, and a layout pattern is formed on a wafer by projection exposure using the formed photomask, is repeated multiple times. At this time, in the case of a typical photomask, a pattern is formed depending on the presence or absence of light-shielding portions provided on a quartz substrate.

In recent years, as semiconductor integrated circuits are miniaturized, patterns formed on photomasks are also miniaturized, and patterns subjected to projection exposure are miniaturized as well. As a pattern is miniaturized, an interference effect due to an optical diffraction phenomenon is caused significantly, and a pattern considerably different from original design data is transferred to a wafer. This reduces the yield of integrated circuits that are formed finally and causes problems in the operations of the integrated circuits.

Examples of the optical interference effect are shown in FIGS. 9A and 9B. FIG. 9A shows a corner of a pattern portion according to photomask design data. When this pattern portion is subjecting to projection exposure, a pattern portion shown in FIG. 9B is obtained. The corner of the pattern portion is lost and rounded.

In order to reduce this kind of pattern deformation after projection exposure due to the optical interference effect, a technology referred to as OPC (Optical Proximity effect Correction) has been developed. This relates to a method wherein the influence of the optical diffraction effect is evaluated, for example, by optical simulation or a test pattern actually subjected to projection exposure, and the photomask pattern based on design data is corrected on the basis of the result of the evaluation so that the pattern to be formed by projection exposure is reproduced so as to be more faithful to the design data.

Typical examples of OPC are shown in FIGS. 9C and 9D. The end of the pattern portion shown in FIG. 9C is deformed from that of the pattern portion shown in FIG. 9A and based on the photomask design data. The pattern portion obtained after exposure is shown in FIG. 9D. The retraction amount of the corner in FIG. 9D is less than that in FIG. 9B. It is thus found that the pattern portion has been reproduced so as to be more faithful to the design data.

However, this kind of correction of design data causes pseudo errors in a photomask testing process wherein a verification is made as to whether a photomask pattern has been formed properly or not on the basis of the design data during photomask manufacturing. This causes problems of increasing testing time and cost.

FIG. 10A is an explanatory view showing an example of pattern portions based on the design data not subjected to OPC. With respect to the pattern portions based on the data and shown in FIG. 10A, a photomask is manufactured and tested in accordance with the photomask defect testing method shown in the flowchart of FIG. 11.

In this photomask defect testing method, first, the shape of a photomask manufactured (at S33) on the basis of photomask design data D20 is read by an optical sensor, and sensor data D22 obtained by recording the actual shape of the photomask is created (at S34) as one step. Furthermore, as the other step, reference data D21 is created (at S30) in consideration of the rounding or the like of corners on the basis of the photomask design data D20. Then, the sensor data D22 is compared with the reference data D21 (at S31), and locations wherein differences occur are detected as defects (at S32).

However, in the conventional photomask testing method shown in FIG. 11, in the case of design pattern portions subjected to OPC as shown in FIG. 10B, pseudo errors occur and test time may increase, whereby cost may increase. This is mainly because the optical sensor of a testing apparatus for reading the shape of the photomask has a limit in sensitivity. Therefore, in the case when the widths of pattern portions or pattern spaces are a certain value or less, these cannot be read properly. As a result, differences occur from the reference data, and these are judged as pseudo errors.

For example, a case is considered wherein the width of a space readable by a testing apparatus without causing errors is 600 nm and a photomask for ¼-reduction projection is manufactured. In this case, 600/4=150 nm or more is a range readable by the testing apparatus without causing errors. For example, when a space of 160 nm shown in FIG. 12A according to design data becomes 145 nm according to data obtained after OPC as shown in FIG. 12B, the testing apparatus judges that a pseudo error has occurred. Hence, the testing process is stopped to check the location of the error, whereby the testing process is delayed.

To solve this problem, methods of preventing pseudo errors in the testing process have been proposed. One of them is a method of limiting the OPC process. This is a method wherein when optical correction is carried out, the correction amounts of design data are limited within a range in which the testing apparatus does not cause errors.

For example, in the case when the width of a space readable by the testing apparatus without causing errors, a value converted with respect to design data, is 150 nm, the data is corrected so that the width of the space does not become 150 nm or less as shown in FIGS. 12C and 12D.

However, in this method, although no error occurs in the testing process, the correction amount is limited to a value smaller than the optimum value. Hence, in the pattern forming of the photolithography process, the formed pattern becomes considerably different from the intended pattern.

As another method, Japanese Laid-open Patent Application 2001-272770 discloses a photomask defect testing method wherein an error region judgment step is added to the reference data creation step. FIG. 13 is a flowchart showing this photomask defect testing method.

In this photomask defect testing method, photomask design data D23 before correction is subjected to correction (optical proximity effect correction) by a predetermined method on the basis of measurement values, and corrected photomask design data D24 is created (at S35).

Next, the shape of a photomask manufactured (at S39) on the basis of the corrected photomask design data D24 is read by an optical sensor, and sensor data D26 obtained by recording the actual shape of the photomask is created (at S40) as one step. Furthermore, as the other step, reference data D25 is created (at S36) in consideration of the rounding or the like of corners on the basis of the corrected photomask design data D24.

At the step (S36) of creating the reference data D25, a judgment step shown in the flowchart of FIG. 14 is added. In this step, the corrected photomask design data D24 is read, and a judgment is made as to whether the pattern to be tested is a pattern having regions with conditions below the error judgment conditions of the photomask testing (at S41). In the case when the pattern has regions with conditions below the error judgment conditions, the regions are excluded (at S43), and data in other regions is created as reference data D25 (at S42). Next, the sensor data D26 is compared with the reference data D25 (at S37), and locations wherein differences have occurred are detected as defects (at S38).

However, this photomask defect testing method has some problems. One problem is described below. Since the step (S36) of creating the reference data D25 is carried out in parallel with the photomask manufacturing step (S39), even if it is found that the non-testing region data extracted at the reference data creating step (S36) is improper and that this improperness is caused by the photomask design data D23 before correction or the OPC processing step (S35), photomask manufacturing is proceeding, and this causes extra cost increase.

In addition, another problem is described below. Even in the case of particular design pattern portions that are known beforehand to be judged as error regions after the OPC correction (at S35), the pattern portions must be tested at all times with respect to the corrected photomask design data D24, and this causes cost increase.

Furthermore, still another problem is described below. In the case when the apparatus for creating the reference data D25 is integrated with the photomask testing apparatus, just as in a usual case, the programs for all these testing apparatuses must be modified and rewritten, and this causes cost increase. Still further, since the photomask testing apparatus includes components relating to S40, D26, S36 and D25 shown in FIG. 13 and these components are integrated into a completed product by the manufacturer of the apparatus, program modification takes much time and effort.

SUMMARY OF THE INVENTION

In consideration of the above-mentioned circumstances, the present invention is intended to provide a photomask defect testing method capable of preventing delay owing to the occurrence of pseudo errors and also capable of preventing reduction in defect testing accuracy in a photomask defect testing process carried out for a pattern obtained when a design pattern is subjected to optical proximity effect correction.

The present invention is also intended to provide a photomask manufacturing method of manufacturing photomasks tested by the photomask defect testing method in accordance with the present invention.

The present invention is also intended to provide a semiconductor integrated circuit manufacturing method of manufacturing semiconductor integrated circuits by using photomasks manufactured by the photomask manufacturing method in accordance with the present invention.

The photomask defect testing method in accordance with the present invention comprises a first step of creating corrected photomask design data by correcting photomask design data obtained on the basis of device design so that the exposure transfer pattern according to the photomask design data becomes closer to that according to the photomask design data before correction, a second step of creating reference data for photomask defect testing according to the corrected photomask design data, a third step of creating sensor data by measuring the shape of the photomask formed on the basis of the corrected photomask design data using a sensor, and a fourth step of detecting defects on the photomask by comparing the reference data with the sensor data, characterized in that the first step further comprises a step of extracting first non-testing region data indicating non-testing regions including pattern portions having a predetermined width or less and pattern spaces having a predetermined value or less from the photomask design data, a step of selecting the first non-testing region data on the basis of a predetermined standard by comparing the extracted first non-testing region data with the photomask design data before correction corresponding to the non-testing regions, and a step of storing the selected first non-testing region data so as to be included in the corrected photomask design data, and the fourth step further comprises a step of excluding the non-testing regions on the photomask indicated by the first non-testing region data and comparing the reference data with the sensor data.

According to this photomask defect testing method, at the first step, corrected photomask design data is created by correcting photomask design data obtained on the basis of device design so that the exposure transfer pattern according to the photomask design data becomes closer to that according to the photomask design data before correction, and at the second step, reference data for photomask defect testing is created according to the corrected photomask design data. At the third step, sensor data is created by measuring the shape of the photomask formed on the basis of the corrected photomask design data using a sensor, and at the fourth step, defects on the photomask are detected by comparing the reference data with the sensor data.

At the first step, first non-testing region data indicating non-testing regions including pattern portions having a predetermined width or less and pattern spaces having a predetermined value or less is extracted from the photomask design data, the first non-testing region data is selected on the basis of a predetermined standard by comparing the extracted first non-testing region data with the photomask design data before correction corresponding to the non-testing regions. In addition, the selected first non-testing region data is stored so as to be included in the corrected photomask design data. At the fourth step, the non-testing regions on the photomask indicated by the first non-testing region data are excluded and the reference data is compared with the sensor data.

Hence, the present invention can attain a photomask defect testing method capable of preventing delay owing to the occurrence of pseudo errors and also capable of preventing reduction in defect testing accuracy in the photomask defect testing process carried out for a pattern obtained when a design pattern is subjected to optical proximity effect correction.

In the conventional photomask defect testing method, since the photomask testing apparatus includes components relating to S40, D26, S36 and D25 shown in FIG. 13 and these components are integrated into a completed product by the manufacturer of the apparatus as described above, program modification takes much time and effort. However, in the photomask defect testing method in accordance with the present invention, the testing is carried out, for example, at the steps of S35 and D24 in FIG. 13, using CAD by engineers. Hence, program editing is easy.

The photomask defect testing method in accordance with the present invention is characterized in that the photomask design data includes beforehand second non-testing region data indicating non-testing regions including pattern portions having a predetermined width or less and pattern spaces having a predetermined value or less, and the first step further comprises a step of finally creating non-testing region data by ORing the first non-testing region data with the second non-testing region data.

According to this photomask defect testing method, the photomask design data includes beforehand the second non-testing region data indicating non-testing regions including pattern portions having a predetermined width or less and pattern spaces having a predetermined value or less. Furthermore, the first step finally creates non-testing region data by ORing the first non-testing region data with the second non-testing region data.

Hence, the present invention can attain a photomask defect testing method capable of preventing delay owing to the occurrence of pseudo errors and also capable of preventing reduction in defect testing accuracy in the photomask defect testing process carried out for a pattern obtained when a design pattern is subjected to optical proximity effect correction.

The photomask defect testing method in accordance with the present invention comprises a first step of creating corrected photomask design data by correcting photomask design data obtained on the basis of device design so that the exposure transfer pattern according to the photomask design data becomes closer to that according to the photomask design data before correction, a second step of creating reference data for photomask defect testing according to the corrected photomask design data, a third step of creating sensor data by measuring the shape of the photomask formed on the basis of the corrected photomask design data using a sensor, and a fourth step of detecting defects on the photomask by comparing the reference data with the sensor data, characterized in that the photomask design data includes non-testing region data indicating non-testing regions including pattern portions having a predetermined width or less and pattern spaces having a predetermined value or less, and at the fourth step, the non-testing regions on the photomask, indicated by the non-testing region data, are excluded and the reference data is compared with the sensor data.

According to this photomask defect testing method, at the first step, corrected photomask design data is created by correcting photomask design data obtained on the basis of device design so that the exposure transfer pattern according to the photomask design data becomes closer to that according to the photomask design data before correction, and at the second step, reference data for photomask defect testing is created according to the corrected photomask design data. At the third step, sensor data is created by measuring the shape of the photomask formed on the basis of the corrected photomask design data using a sensor, and at the fourth step, defects on the photomask are detected by comparing the reference data with the sensor data.

The photomask design data includes non-testing region data indicating non-testing regions including pattern portions having a predetermined width or less and pattern spaces having a predetermined value or less, and at the fourth step, the non-testing regions on the photomask, indicated by the non-testing region data, are excluded and the reference data is compared with the sensor data.

Hence, the present invention can attain a photomask defect testing method capable of preventing delay owing to the occurrence of pseudo errors and also capable of preventing reduction in defect testing accuracy in the photomask defect testing process carried out for a pattern obtained when a design pattern is subjected to optical proximity effect correction.

The photomask defect testing method in accordance with the present invention is characterized in that the predetermined width and the predetermined value are the minimum value detectable at the fourth step.

According to this photomask defect testing method, since the predetermined width and the predetermined value are the minimum value detectable at the fourth step, the present invention can attain a photomask defect testing method capable of preventing delay owing to the occurrence of pseudo errors and also capable of preventing reduction in defect testing accuracy in the photomask defect testing process carried out for a pattern obtained when a design pattern is subjected to optical proximity effect correction.

The photomask manufacturing method in accordance with the present invention is characterized in that photomasks tested by the photomask defect testing method in accordance with the present invention are manufactured. Examples of more concrete configurations of the photomask manufacturing method will be described below.

The photomask manufacturing method of manufacturing photomasks by testing photomask defects in accordance with the present invention comprises a first step of creating corrected photomask design data by correcting photomask design data obtained on the basis of device design so that the exposure transfer pattern according to the photomask design data becomes closer to that according to the photomask design data before correction, a second step of creating reference data for photomask defect testing according to the corrected photomask design data, a third step of creating sensor data by measuring the shape of the photomask formed on the basis of the corrected photomask design data using a sensor, and a fourth step of detecting defects on the photomask by comparing the reference data with the sensor data, characterized in that the first step further comprises a step of extracting first non-testing region data indicating non-testing regions including pattern portions having a predetermined width or less and pattern spaces having a predetermined value or less from the photomask design data, a step of selecting the first non-testing region data on the basis of a predetermined standard by comparing the extracted first non-testing region data with the photomask design data before correction corresponding to the non-testing regions, and a step of storing the selected first non-testing region data so as to be included in the corrected photomask design data, and the fourth step further comprises a step of excluding the non-testing regions on the photomask indicated by the first non-testing region data and comparing the reference data with the sensor data.

The photomask manufacturing method of manufacturing photomasks by testing photomask defects in accordance with the present invention comprises a first step of creating corrected photomask design data by correcting photomask design data obtained on the basis of device design so that the exposure transfer pattern according to the photomask design data becomes closer to that according to the photomask design data before correction, a second step of creating reference data for photomask defect testing according to the corrected photomask design data, a third step of creating sensor data by measuring the shape of the photomask formed on the basis of the corrected photomask design data using a sensor, and a fourth step of detecting defects on the photomask by comparing the reference data with the sensor data, characterized in that the photomask design data includes non-testing region data indicating non-testing regions including pattern portions having a predetermined width or less and pattern spaces having a predetermined value or less, and at the fourth step, the non-testing regions on the photomask, indicated by the non-testing region data, are excluded and the reference data is compared with the sensor data.

In this photomask manufacturing method, since photomasks tested by the photomask defect testing method in accordance with the present invention are manufactured, the present invention can attain a photomask manufacturing method capable of preventing delay owing to the occurrence of pseudo errors and also capable of preventing reduction in defect testing accuracy in the photomask defect testing process carried out for a pattern obtained when a design pattern is subjected to optical proximity effect correction.

The semiconductor integrated circuit manufacturing method in accordance with the present invention is characterized in that semiconductor integrated circuits are manufactured by using photomasks manufactured by the photomask manufacturing method in accordance with the present invention. Examples of more concrete configurations of the semiconductor integrated circuit manufacturing method will be described below.

The semiconductor integrated circuit manufacturing method of manufacturing semiconductor integrated circuits by using photomasks in accordance with the present invention comprises a first step of creating corrected photomask design data by correcting photomask design data obtained on the basis of device design so that the exposure transfer pattern according to the photomask design data becomes closer to that according to the photomask design data before correction, a second step of creating reference data for photomask defect testing according to the corrected photomask design data, a third step of creating sensor data by measuring the shape of the photomask formed on the basis of the corrected photomask design data using a sensor, and a fourth step of detecting defects on the photomask by comparing the reference data with the sensor data, characterized in that the first step further comprises a step of extracting first non-testing region data indicating non-testing regions including pattern portions having a predetermined width or less and pattern spaces having a predetermined value or less from the photomask design data, a step of selecting the first non-testing region data on the basis of a predetermined standard by comparing the extracted first non-testing region data with the photomask design data before correction corresponding to the non-testing regions, and a step of storing the selected first non-testing region data so as to be included in the corrected photomask design data, and the fourth step further comprises a step of excluding the non-testing regions on the photomask indicated by the first non-testing region data and comparing the reference data with the sensor data.

The semiconductor integrated circuit manufacturing method of manufacturing semiconductor integrated circuits by using photomasks in accordance with the present invention comprises a first step of creating corrected photomask design data by correcting photomask design data obtained on the basis of device design so that the exposure transfer pattern according to the photomask design data becomes closer to that according to the photomask design data before correction, a second step of creating reference data for photomask defect testing according to the corrected photomask design data, a third step of creating sensor data by measuring the shape of the photomask formed on the basis of the corrected photomask design data using a sensor, and a fourth step of detecting defects on the photomask by comparing the reference data with the sensor data, characterized in that the photomask design data includes non-testing region data indicating non-testing regions including pattern portions having a predetermined width or less and pattern spaces having a predetermined value or less, and at the fourth step, the non-testing regions on the photomask, indicated by the non-testing region data, are excluded and the reference data is compared with the sensor data.

In this semiconductor integrated circuit manufacturing method, since semiconductor integrated circuits are manufactured by using photomasks manufactured by the photomask manufacturing method in accordance with the present invention, the present invention can attain a semiconductor integrated circuit manufacturing method capable of preventing delay owing to the occurrence pseudo errors and also capable of preventing reduction in defect testing accuracy in the photomask defect testing process carried out for a pattern obtained when a design pattern is subjected to optical proximity effect correction.

The above and further objects and features of the invention will more fully be apparent from the following detailed description with accompanying drawings.

BRIEF DESCRIPTION OF THE DRAWINGS

FIG. 10A is an explanatory view showing still another example of optical proximity effect correction in the photomask defect testing method;

FIG. 10B is an explanatory view showing still another example of optical proximity effect correction in the photomask defect testing method;

DETAILED DESCRIPTION OF THE PREFERRED EMBODIMENTS

A photomask defect testing method, a photomask manufacturing method and a semiconductor integrated circuit manufacturing method in accordance with the present invention will be described below on the basis of the drawings showing the methods.

In the photomask defect testing method in accordance with the present invention, pattern portions indicating regions causing pseudo defects during photomask testing are distinguished by using different indicators on corrected photomask design data having been subjected to optical proximity effect correction, and the data of the pattern portions is stored so as to be included in the corrected photomask design data.

EMBODIMENT 1

Figure 1:
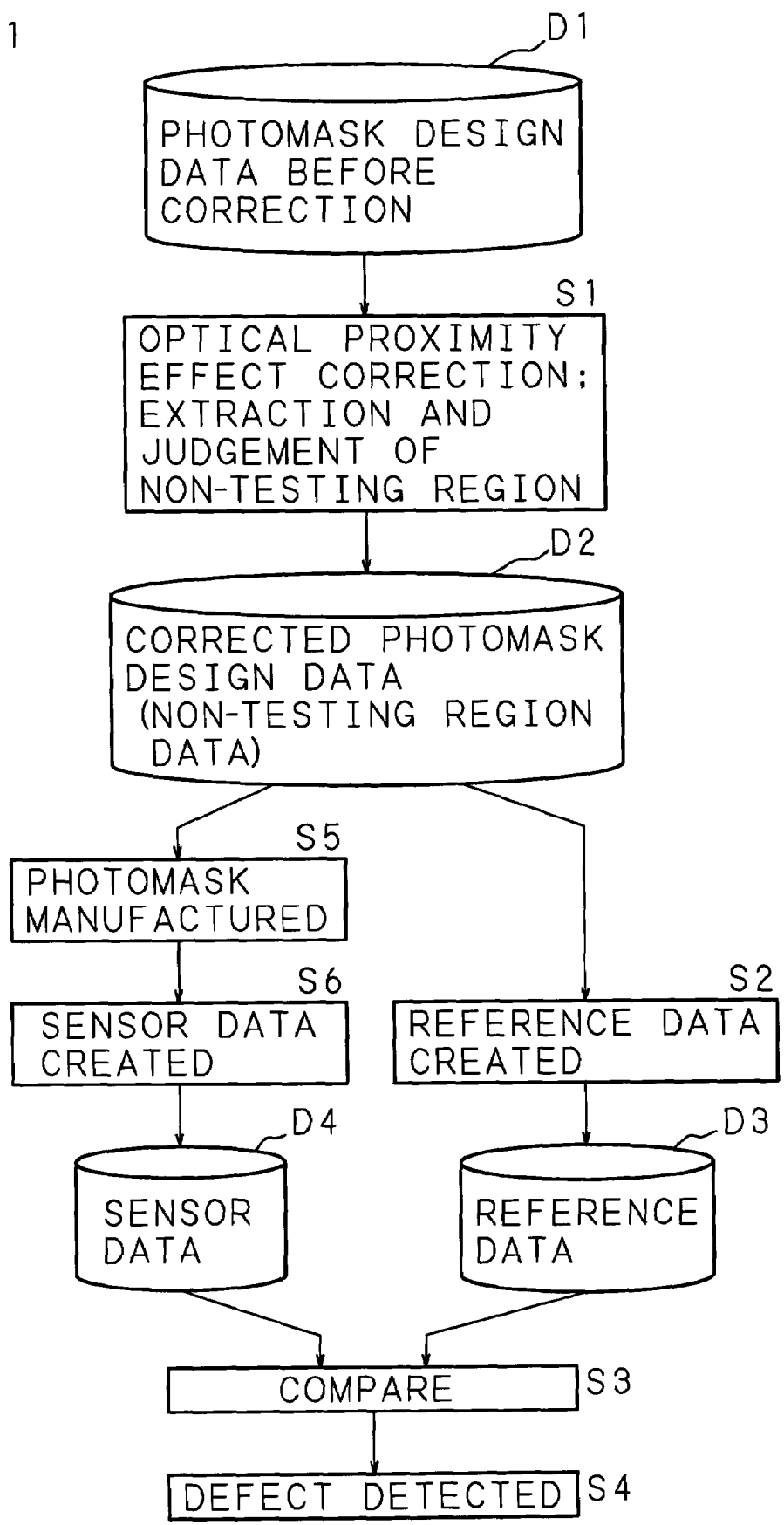
FIG. 1 is a flowchart showing an embodiment of a photomask defect testing method in accordance with the present invention.

In this photomask defect testing method shown in FIG. 1, first, with respect to photomask design data D1 before correction, optical proximity effect correction and the extraction and judgment of non-testing region designation data are carried out (at S1) (a first step). As a result, corrected photomask design data D2 comprising the data of a corrected photomask design pattern and the data of a pattern wherein non-testing regions are specified so as to be distinguished from the photomask design pattern by using different indicators is created (at S1).

Next, the shape of a photomask manufactured (at S5) on the basis of the corrected photomask design data D2 is read by an optical sensor, and sensor data D4 obtained by recording the actual shape of the photomask is created (at S6) (a third step) as one step. Furthermore, as the other step, reference data D3 is created in consideration of the rounding or the like of corners on the basis of the corrected photomask design data D2 (at S2) (a second step).

Next, the non-testing regions distinguished (at S1) from the photomask design pattern by using different indicators are excluded, the sensor data D4 is referred to and compared with the reference data D3 (at S3) (a fourth step), and locations wherein differences occur are detected as defects (at S4) (the fourth step).

Figure 2:
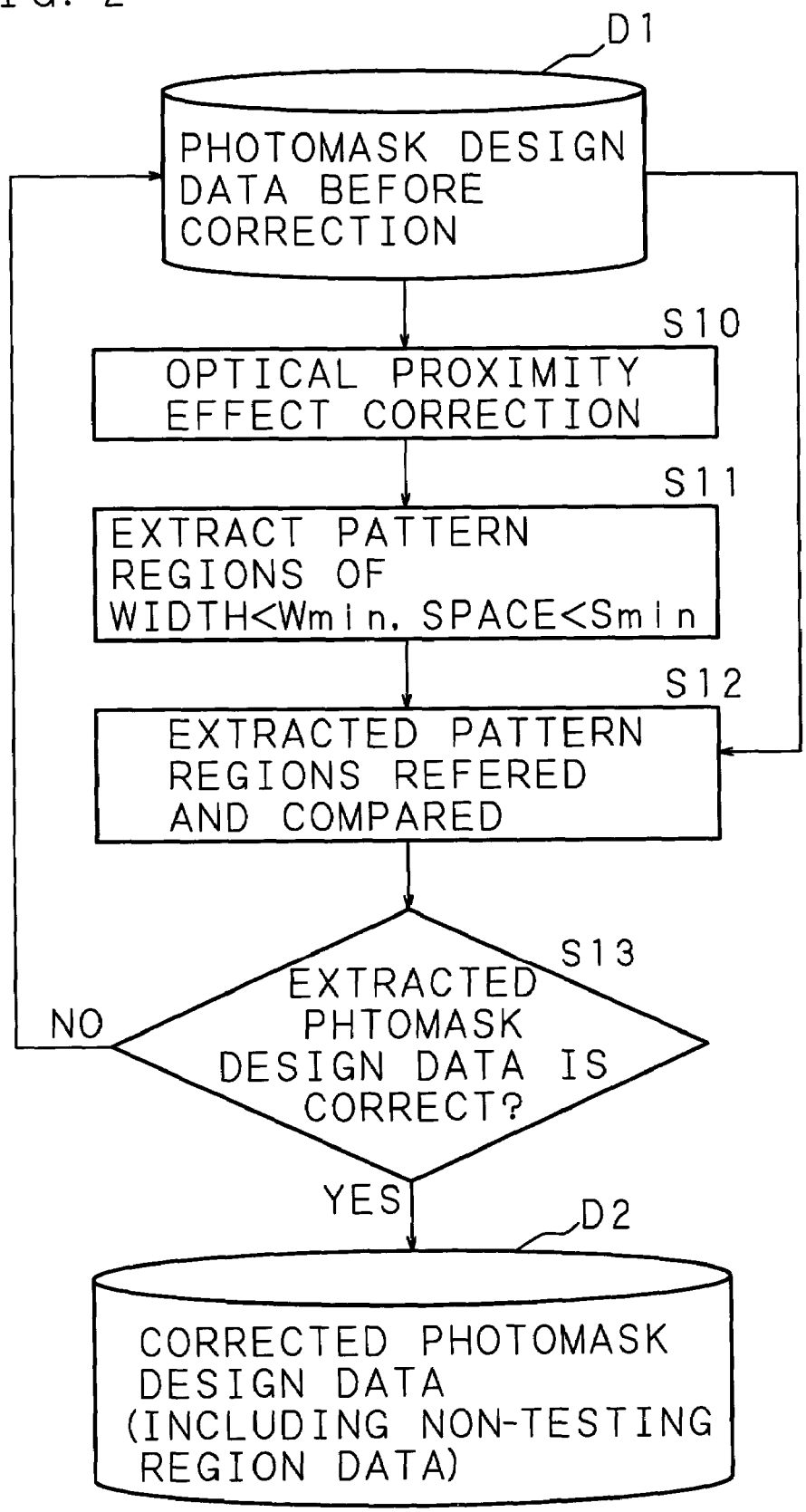
FIG. 2 is a flowchart minutely showing a step wherein optical proximity effect correction and the extraction and judgment of non-testing region designation data are carried out.

FIG. 2 is a flowchart minutely showing the step (S1) wherein the optical proximity effect correction and the extraction and judgment of the non-testing region designation data are carried out.

At the step (S1) wherein the optical proximity effect correction and the extraction and judgment of the non-testing region designation data are carried out, first, the photomask design data D1 before correction is subjected to the optical proximity effect correction (at S10). Next, from the pattern having been subjected to the optical proximity effect correction, regions including pattern portions having the minimum width value Wmin and detectable by a photomask testing apparatus without causing errors and regions including pattern spaces having the minimum space value Smin and detectable by the photomask testing apparatus without causing errors are extracted (at S11).

Next, the extracted pattern regions (at S11) are referred to and compared with the corresponding regions of the pattern based on the photomask design data D1 before correction (at S12). Next, as the result of the reference and comparison, a judgment is made (at S13) as to whether the photomask design data has problems or not on the basis of a predetermined standard. In the case when the photomask design data has problems, the portions having the problems in the photomask design data D1 before correction are corrected and the above steps (S10 and S11) are carried out again. If it is finally judged (at S13) that there is no problem at the extracted regions, corrected photomask design data D2 wherein the extracted non-testing regions including pseudo errors are included as data distinguished by using different indicators is created and stored.

A case wherein optical proximity effect correction, photomask manufacturing and photomask defect testing are carried out on the basis of the photomask design data D1 before correction including design pattern portions drawn so as to have various dimensions to perform process examination and the like will be described below. The minimum value that is determined as an error by a photomask testing apparatus and converted with respect to the photomask design data D1 before correction or the corrected photomask design data D2 is 150 nm in pattern portion width and in pattern space.

Figure 5A:
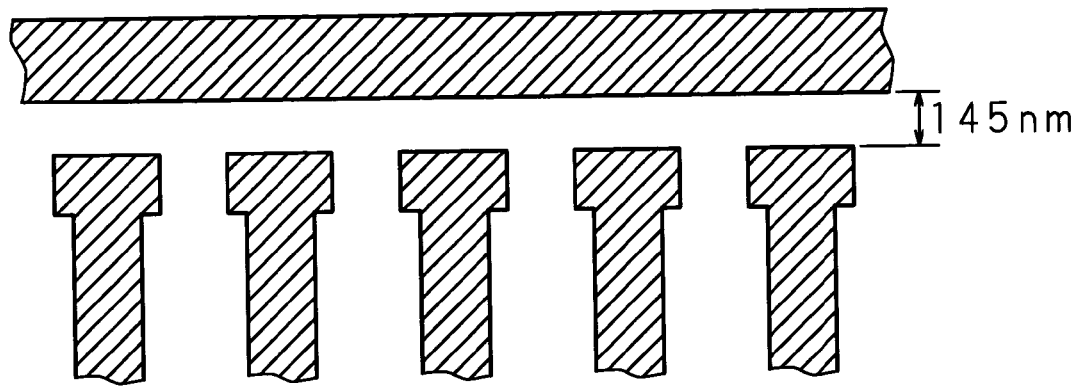
FIG. 5A is an explanatory view showing an example of optical proximity effect correction in the photomask defect testing method in accordance with the present invention.

The optical proximity effect correction is carried out (at S10) on the basis of the photomask design data D1 before correction, and pattern portions having the predetermined dimension or less are extracted (at step S11). An example of the pattern portions is shown in FIG. 5A. Since the distance between the ends of pattern portions and a pattern portion (a line pattern portion) opposite thereto is 145 nm in FIG. 5A, these portions are extracted (at S11).

Figure 5B:
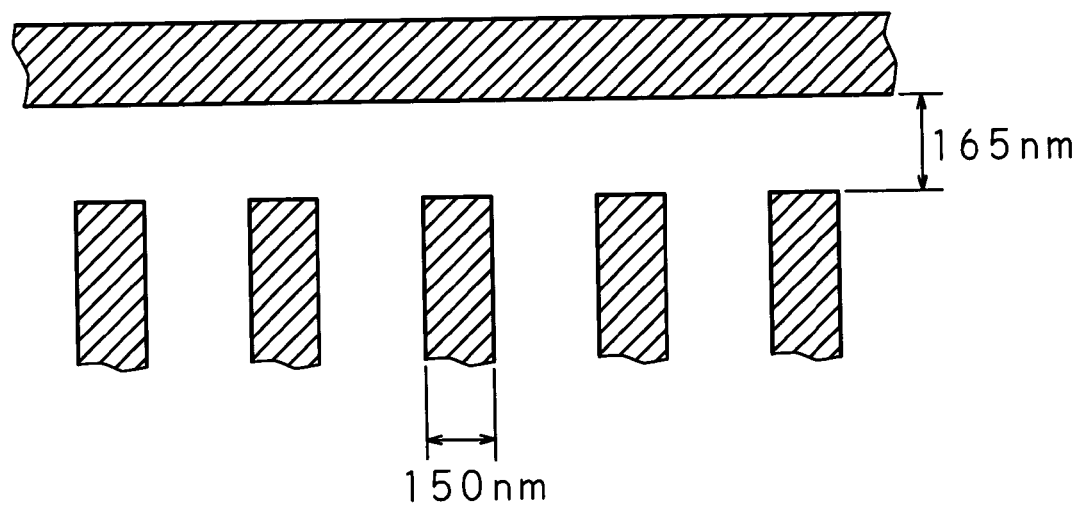
FIG. 5B is an explanatory view showing another example of optical proximity effect correction in the photomask defect testing method in accordance with the present invention.

Next, the pattern portions obtained by referring to the region of the photomask design data D1 before correction corresponding to the extracted pattern portions are shown in FIG. 5B. In the design pattern portions shown in FIG. 5B, the distance from the ends of pattern portions to a pattern portion (a long line pattern portion) opposite thereto is 165 nm, and the widths of the pattern portions arranged cyclically are 150 nm, thereby being designed normally. Hence, the extracted regions (at S11) are distinguished as non-testing regions by using different indicators and stored so as to be included in the corrected photomask design data D2.

Figure 6A:
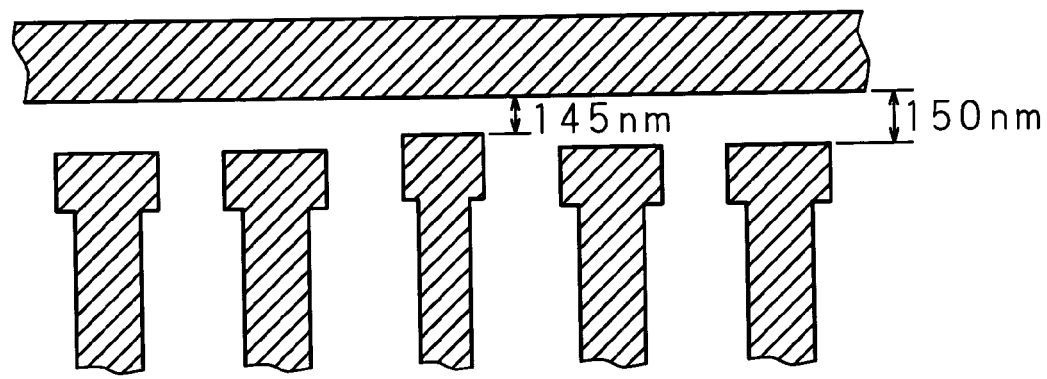
FIG. 6A is an explanatory view showing still another example of optical proximity effect correction in the photomask defect testing method in accordance with the present invention.
Figure 6B:
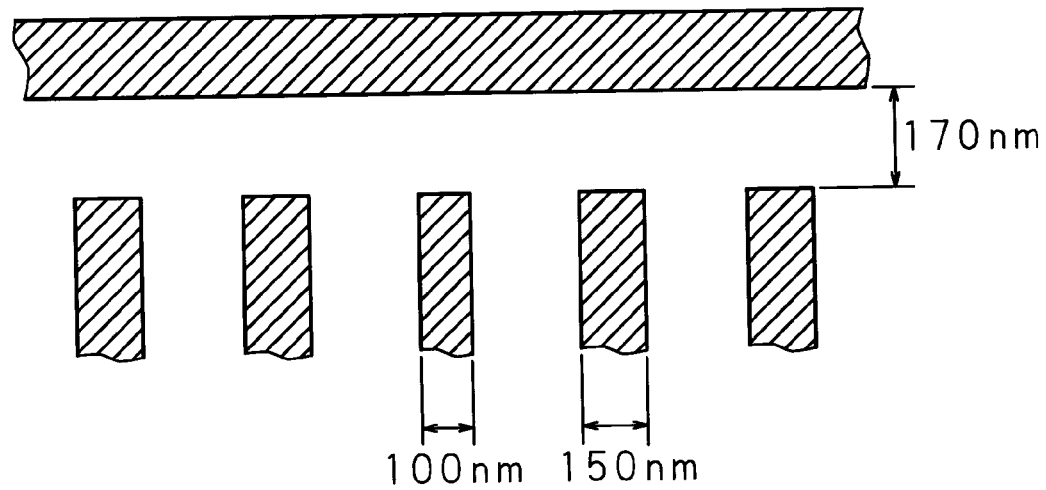
FIG. 6B is an explanatory view showing still another example of optical proximity effect correction in the photomask defect testing method in accordance with the present invention.

Next, another example of extracted pattern portions (at S11) is shown in FIG. 6A. The pattern portions obtained by referring to the region of the photomask design data D1 before correction corresponding to the pattern portions shown in FIG. 6A are shown in FIG. 6B. In FIG. 6B, only one of pattern portions arranged cyclically is drawn to have a width of 100 nm. Hence, in the pattern portions based on the corrected data and shown in FIG. 6A, it is found that the space from the end of the only one pattern portion to a pattern portion (a long line pattern portion) opposite thereto becomes smaller. In this case, the space at the corresponding portion according to the photomask design data D1 before correction is corrected to 150 nm, and the process is carried out again beginning with the optical proximity effect correction.

By the operations described above, on the basis of the data output finally, according to the flowchart shown in FIG. 1, the process from photomask manufacturing to testing is carried out. Regions causing pseudo errors during testing have been extracted as non-testing regions and excluded from objects to be tested. Therefore, pseudo errors can be prevented during testing, and testing time can be shortened.

The photomask having been subjected to the defect testing by using the above-mentioned photomask defect testing method is manufactured, and semiconductor integrated circuits are manufactured by using this manufactured photomask.

EMBODIMENT 2

Figure 3:
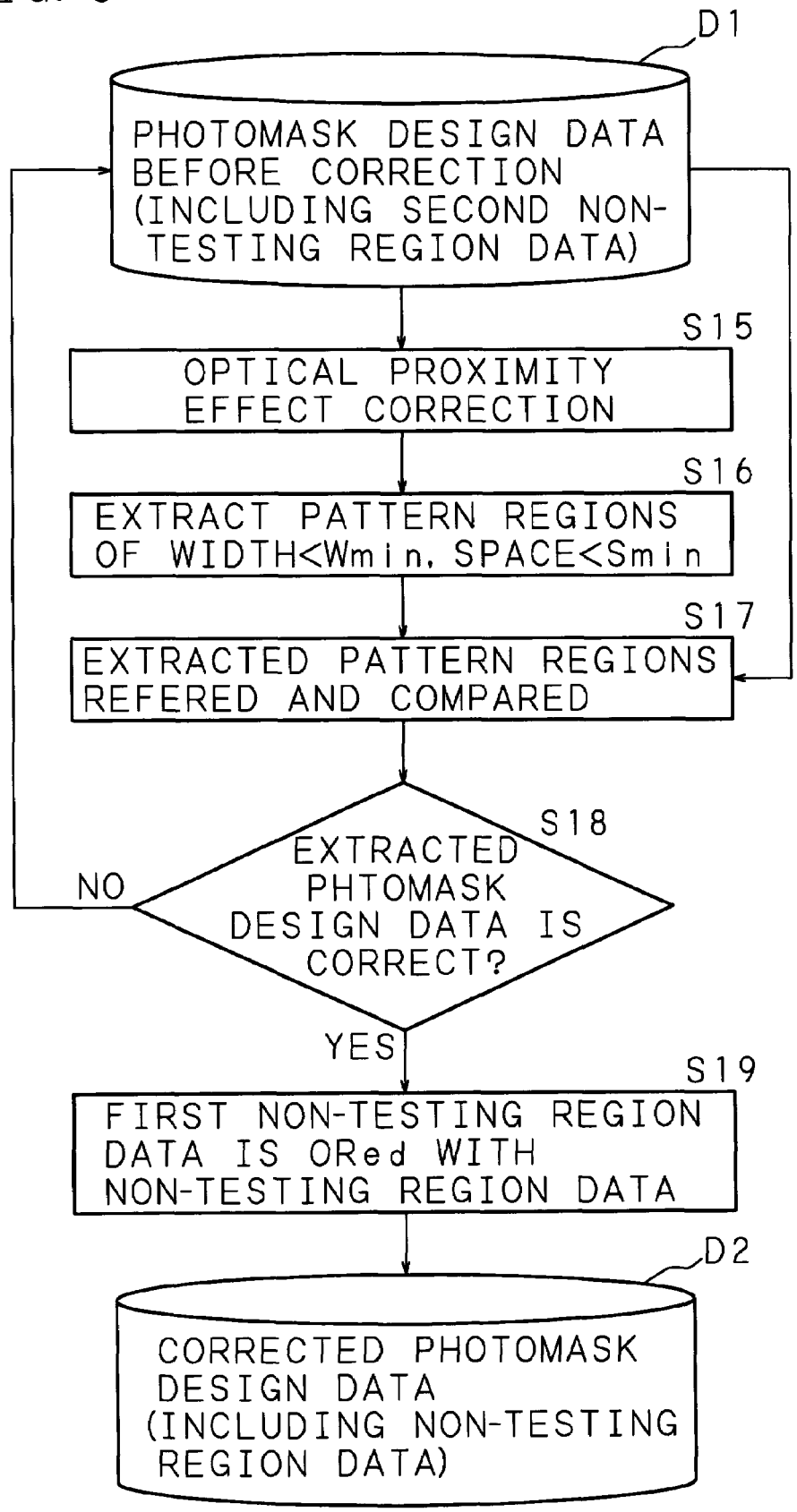
FIG. 3 is a flowchart showing another embodiment of the photomask defect testing method in accordance with the present invention.

FIG. 3 is a flowchart showing Embodiment 2 of the photomask defect testing method in accordance with the present invention. This flowchart minutely shows another embodiment of the step (S1) in the flowchart shown in FIG. 1, wherein the optical proximity effect correction and the extraction and judgment of the non-testing region designation data are carried out. Since the other steps are similar to those shown in the flowchart of FIG. 1, their explanations are omitted.

In this photomask defect testing method, non-testing region data (second non-testing region data) is created beforehand in specific regions in the photomask design data D1 before correction. This is possible, for example, in a case wherein regions including pattern portions having the minimum dimension or less and used for photomask design data, that is, regions including pattern portions having the minimum width value Wmin and detectable by a photomask testing apparatus without causing errors and regions including pattern spaces having the minimum space value Smin and detectable by the photomask testing apparatus without causing errors, have been specified during photomask design.

At the step (S1 in FIG. 1) wherein the optical proximity effect correction and the extraction and judgment of the non-testing region designation data are carried out, first, the photomask design data D1 before correction is subjected to the optical proximity effect correction (at S15 in FIG. 3). Next, from the pattern having been subjected to the optical proximity effect correction, regions including pattern portions having the minimum width value Wmin and detectable by a photomask testing apparatus without causing errors and regions including pattern spaces having the minimum space value Smin and detectable by the photomask testing apparatus without causing errors are extracted (at S16). At this time, the regions indicated by the non-testing region data included in the photomask design data D1 before correction having been created beforehand are excluded from the objects to be extracted.

Next, the extracted pattern regions (at S16) are referred to and compared with the corresponding regions based on the pattern of the photomask design data D1 before correction (at S17). Next, as the result of the reference and comparison, a judgment is made (at S18) as to whether the photomask design data has problems or not on the basis of a predetermined standard. In the case when the photomask design data has problems, the portions having the problems in the photomask design data D1 before correction are corrected and the above steps are carried out again (at S15 and S16). If it is finally judged (at S18) that there is no problem at the extracted regions, the extracted non-testing region data (first non-testing region data) including pseudo errors is ORed (at S19) with the non-testing region data included in the photomask design data D1 before correction having been created beforehand. The corrected photomask design data D2 wherein the non-testing region data obtained as the result of the operation is included as data distinguished by using different indicators is created and stored.

A case wherein optical proximity effect correction, photomask manufacturing and photomask defect testing are carried out for design data including a design pattern in which regions having pattern portions arranged cyclically are distinguished from regions having pattern portions arranged irregularly in specific regions, such as a memory device, will be described below. The minimum value that is determined as an error by a photomask testing apparatus and converted with respect to the photomask design data D1 before correction or the corrected photomask design data D2 is 150 nm in pattern portion width and in pattern space.

Figure 7:
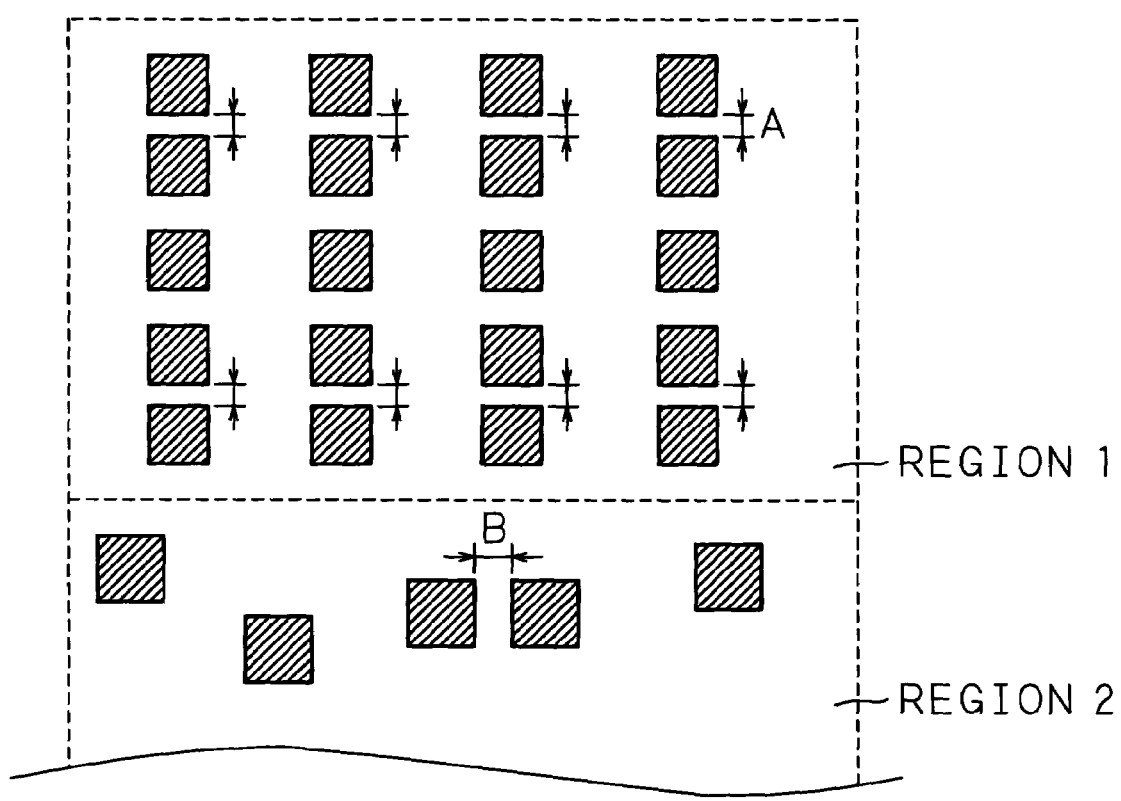
FIG. 7 is an explanatory view showing still another example of optical proximity effect correction in the photomask defect testing method in accordance with the present invention.

FIG. 7 shows a design pattern obtained after photomask design data is subjected to the optical proximity effect correction (at S15), and the dimensions of the regions indicated by A and B are 145 nm, a value not larger than the testable value. The pattern according to the data before the optical proximity effect correction (at S15), corresponding to the design pattern shown in FIG. 7, is shown in FIG. 8.

Figure 8:
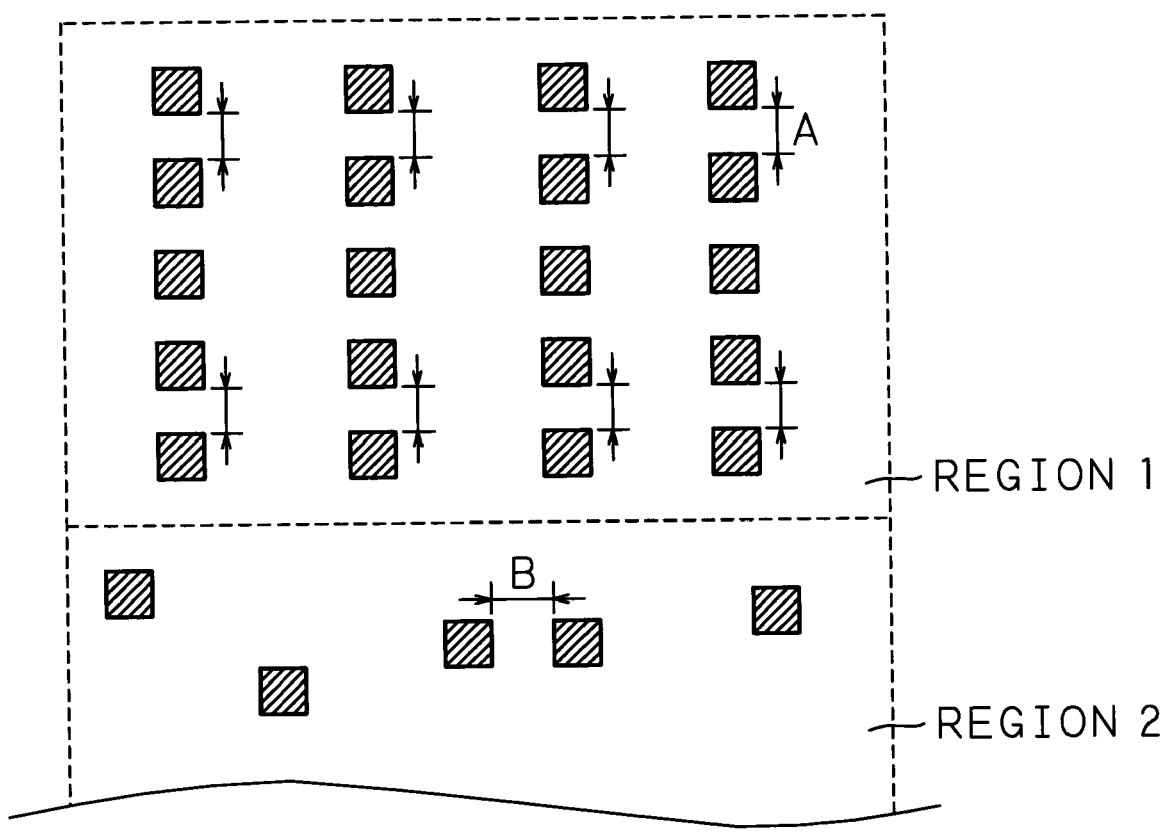
FIG. 8 is an explanatory view showing still another example of optical proximity effect correction in the photomask defect testing method in accordance with the present invention.
Figure 9A:
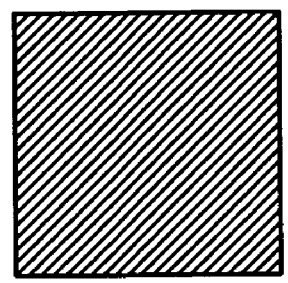
FIG. 9A is an explanatory view showing an example of an optical interference effect on a pattern portion formed on a photomask.
Figure 9B:
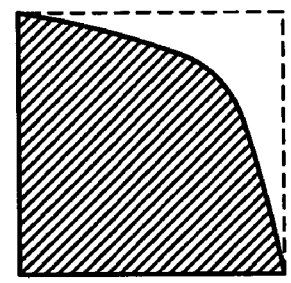
FIG. 9B is an explanatory view showing another example of an optical interference effect on a pattern portion formed on a photomask.
Figure 9C:
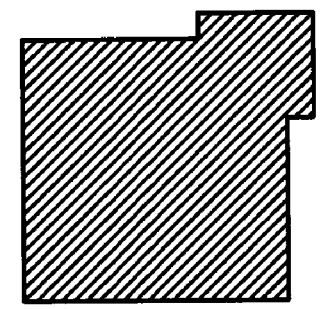
FIG. 9C is an explanatory view showing still another example of an optical interference effect on a pattern portion formed on a photomask.
Figure 9D:
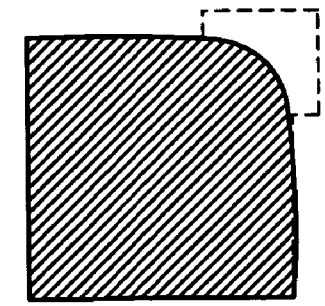
FIG. 9D is an explanatory view showing still another example of an optical interference effect on a pattern portion formed on a photomask.
Figure 11:
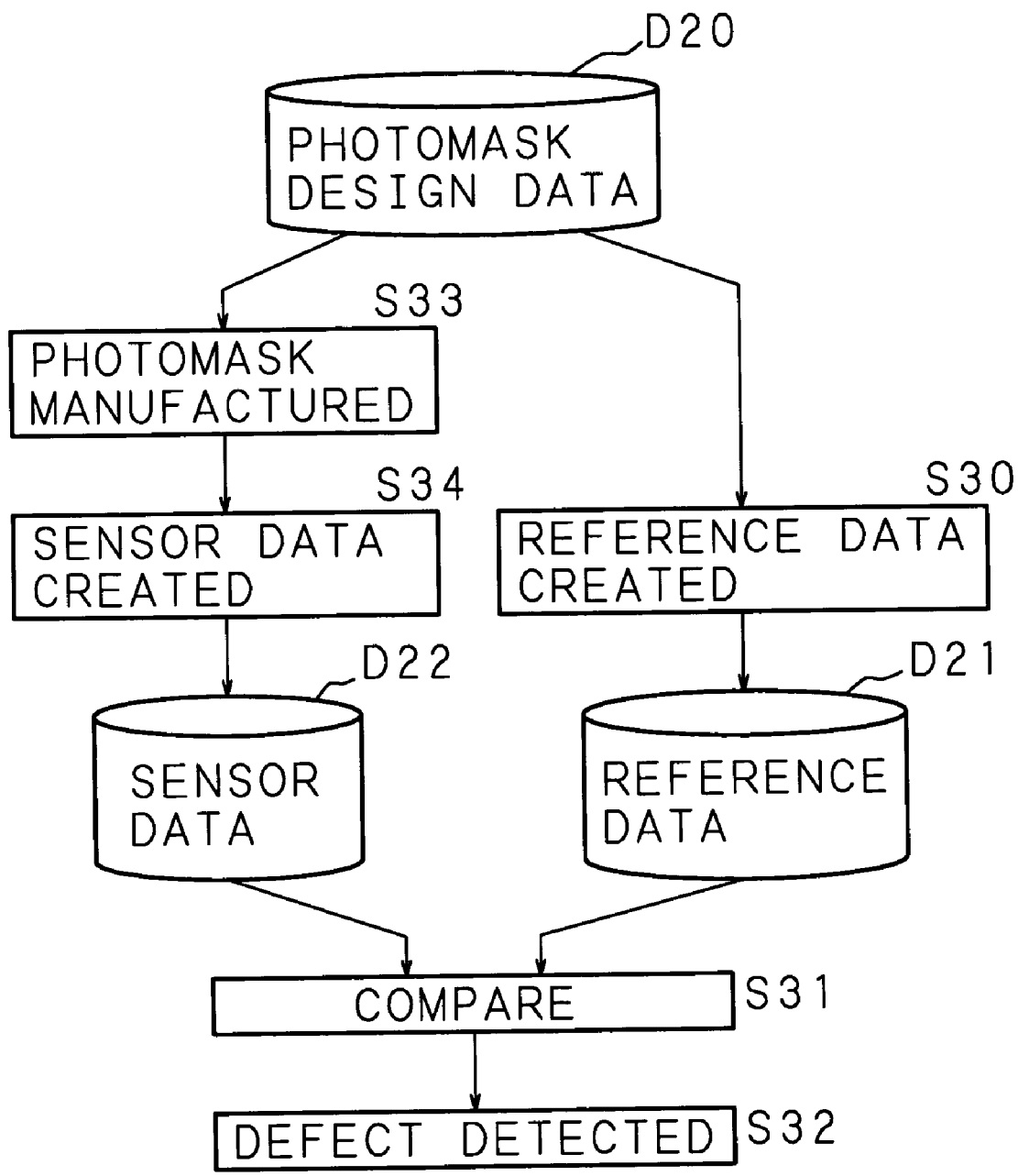
FIG. 11 is a flowchart showing an example of the conventional photomask defect testing method.
Figure 12A:
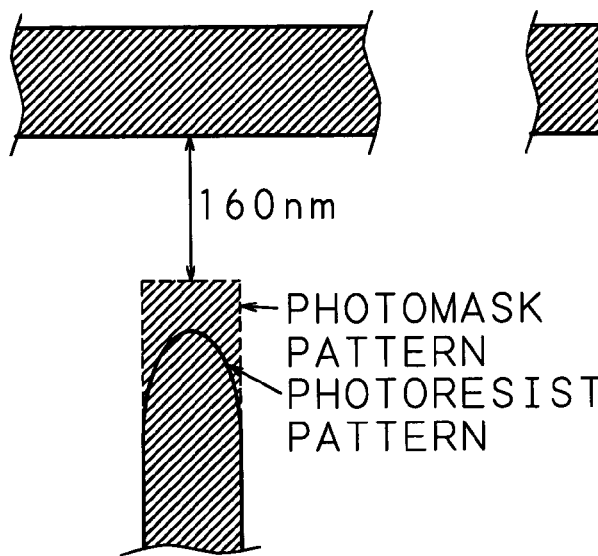
FIG. 12A is an explanatory view showing an example of optical proximity effect correction in the conventional photomask defect testing method.
Figure 12B:
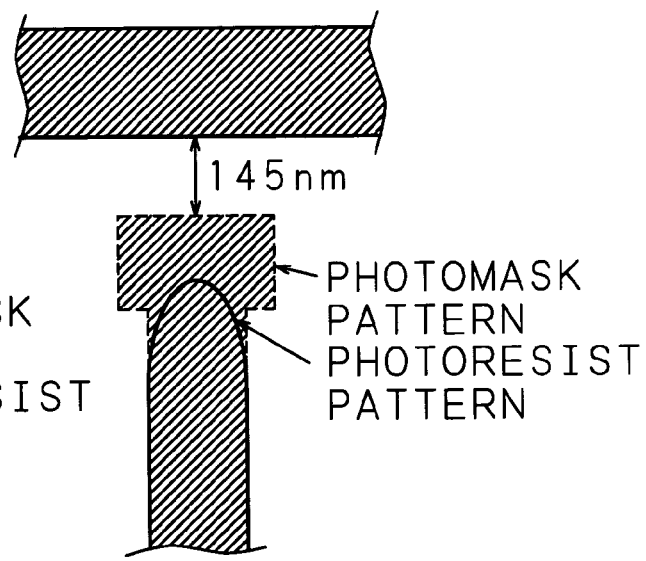
FIG. 12B is an explanatory view showing another example of optical proximity effect correction in the conventional photomask defect testing method.
Figure 12C:
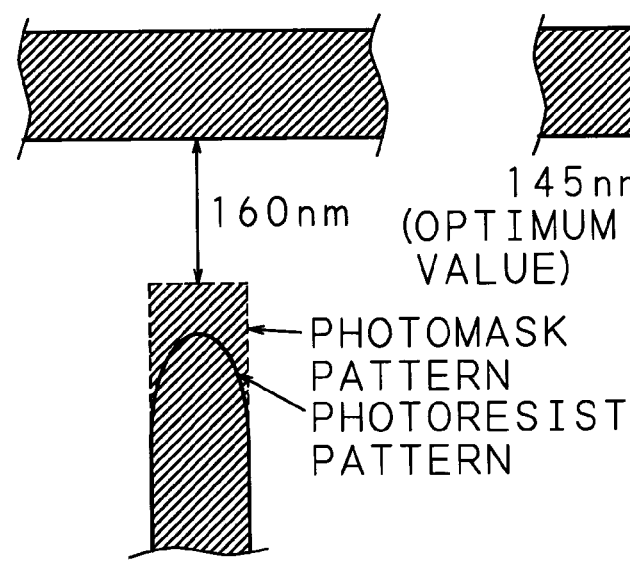
FIG. 12C is an explanatory view showing still another example of optical proximity effect correction in the conventional photomask defect testing method.
Figure 12D:
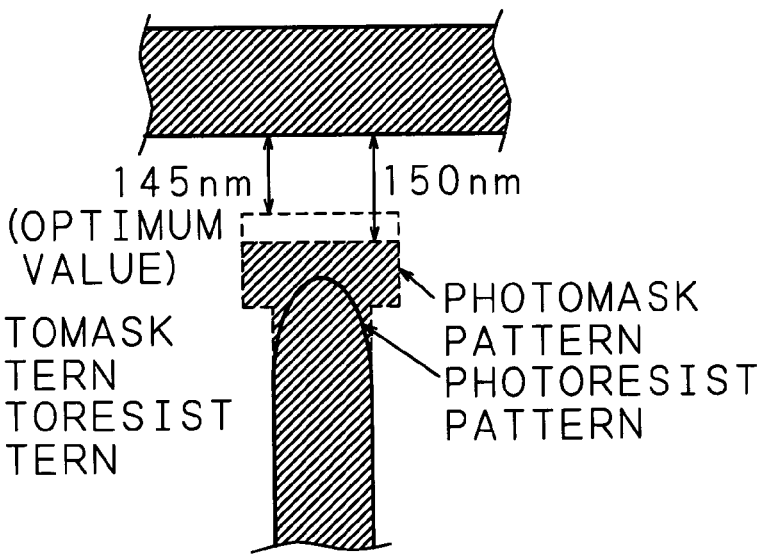
FIG. 12D is an explanatory view showing still another example of optical proximity effect correction in the conventional photomask defect testing method.
Figure 13:
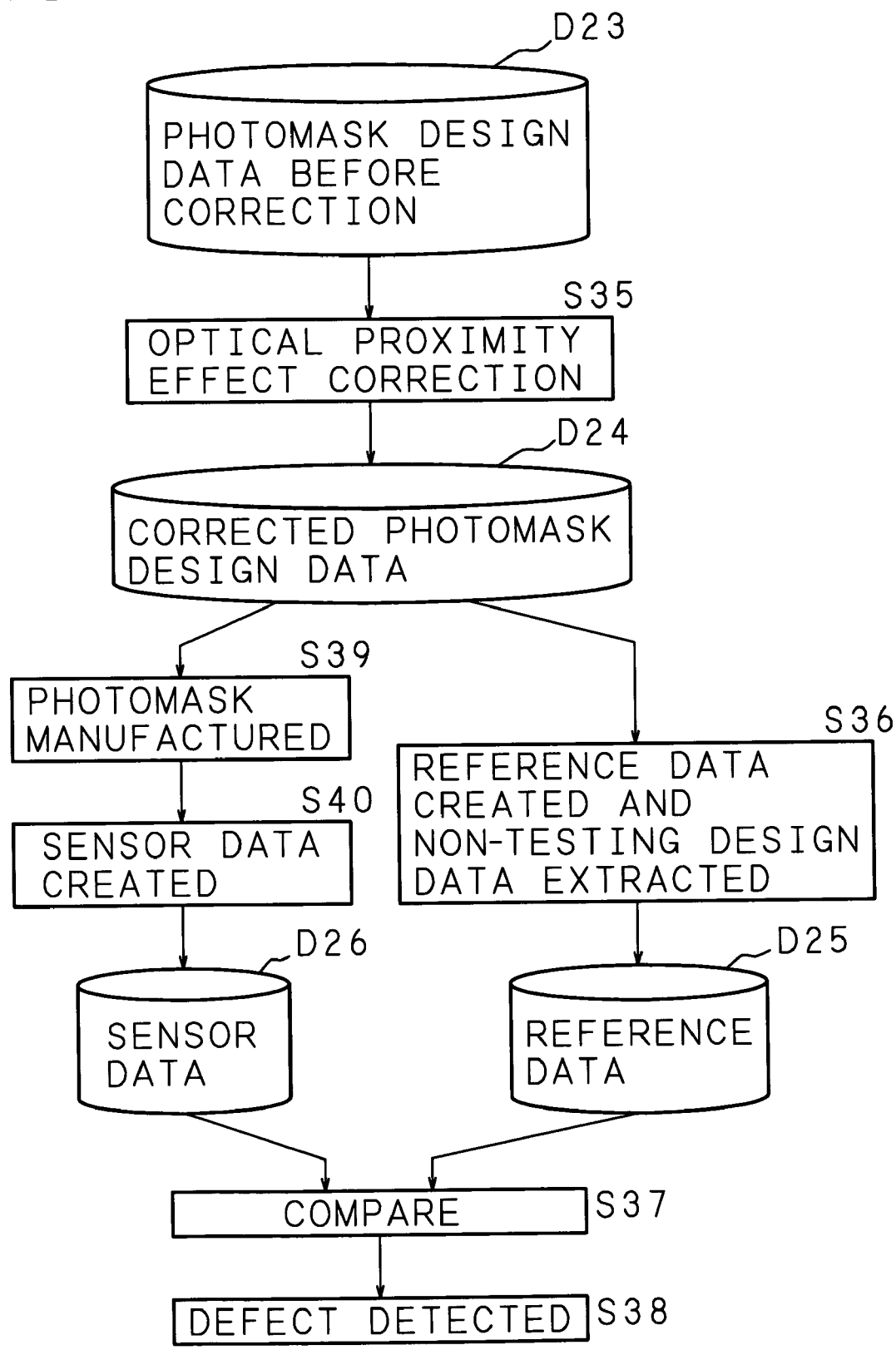
FIG. 13 is a flowchart showing an example of the conventional photomask defect testing method.
Figure 14:
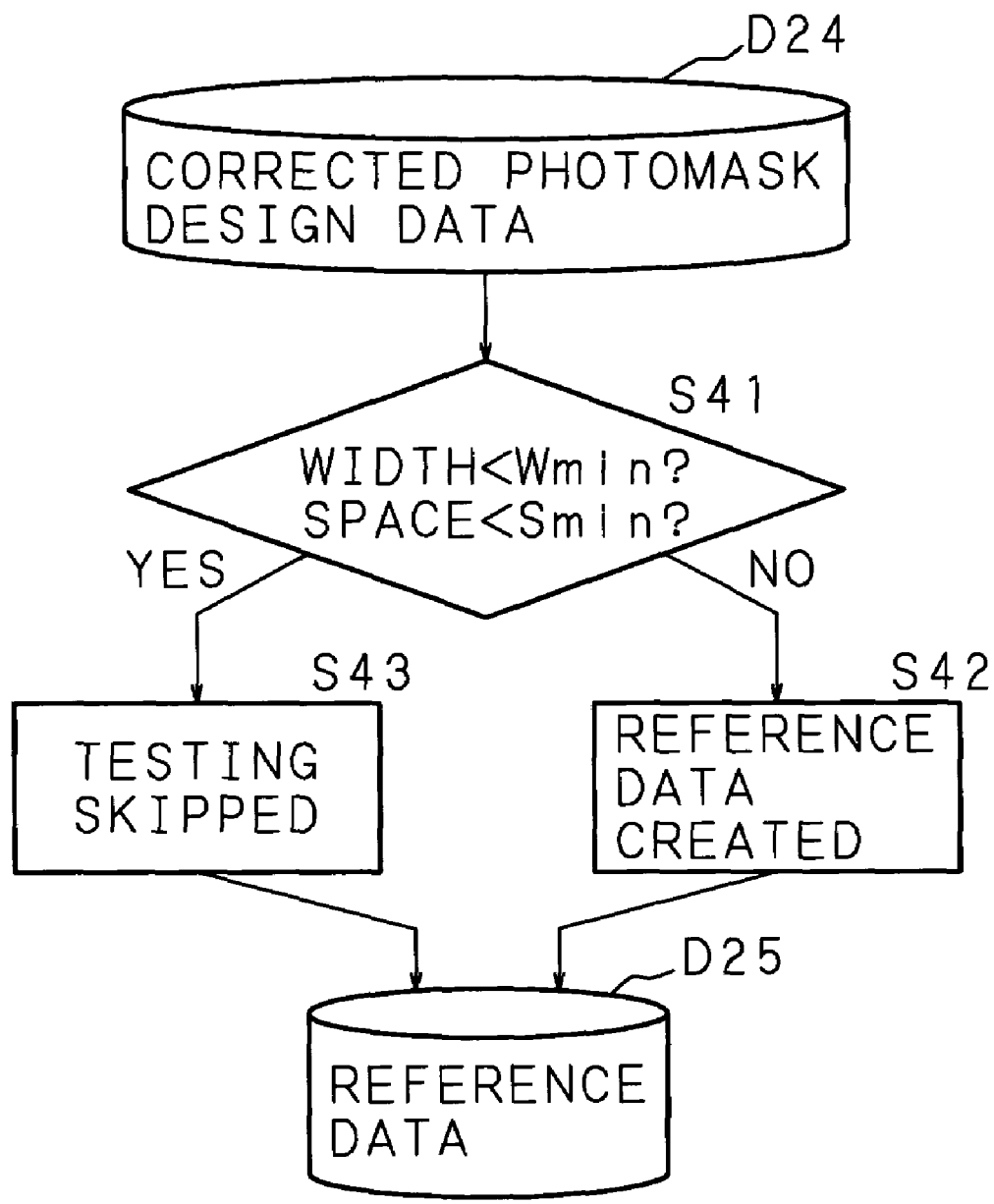
FIG. 14 is a flowchart showing another example of the conventional photomask defect testing method.

In FIG. 8, a region 1 is a memory cell wherein pattern portions are arranged cyclically. In the other region 2, pattern portions are arranged at random. In this case, when error occurrence locations have been specified according to the result of the optical proximity effect correction carried out before for other similar data, processing can be carried out according to the flowchart shown in FIG. 3.

First, the region data including the portions A is created beforehand as non-testing region data distinguished by using different indicators in the data of the region 1 of the photomask design data D1 before correction.

At this time, such cyclically arranged pattern portions as in the region 1 are usually designed to have a structure of repetitive arrangement. Easy arrangement is made possible by drawing non-testing region data in one (or several) of the basic pattern portions of arrangement.

The photomask design data D1 before correction created as described above is subjected to the optical proximity effect correction (at S15), and error locations are extracted (at S16). However, in this case, the optical proximity effect correction and extraction are not required for the region 1 but carried out only for the region 2. For this reason, the processing time for a memory cell or the like including many cyclic pattern portions can be shortened by a factor of several.

In addition to the photomask design data after the optical proximity effect correction (at S15), the corrected photomask design data D2 is created wherein the non-testing region data created by ORing (at S19) the non-testing region data extracted (at S16, S17 and S18) in the region 2 as described above with the non-testing region data in the region 1 is used as data distinguished by using different indicators.

By the operations described above, on the basis of the corrected photomask design data D2 output finally, according to the flowchart shown in FIG. 1, the process from photomask manufacturing to photomask defect testing is carried out. Regions causing pseudo errors during testing have been extracted as non-testing region data and excluded from objects to be subjected to defect testing. Therefore, the occurrence of pseudo errors during photomask defect testing can be prevented, and testing time can be shortened.

The photomask having been subjected to the defect testing by using the above-mentioned photomask defect testing method is manufactured, and semiconductor integrated circuits are manufactured by using this manufactured photomask.

EMBODIMENT 3

Figure 4:
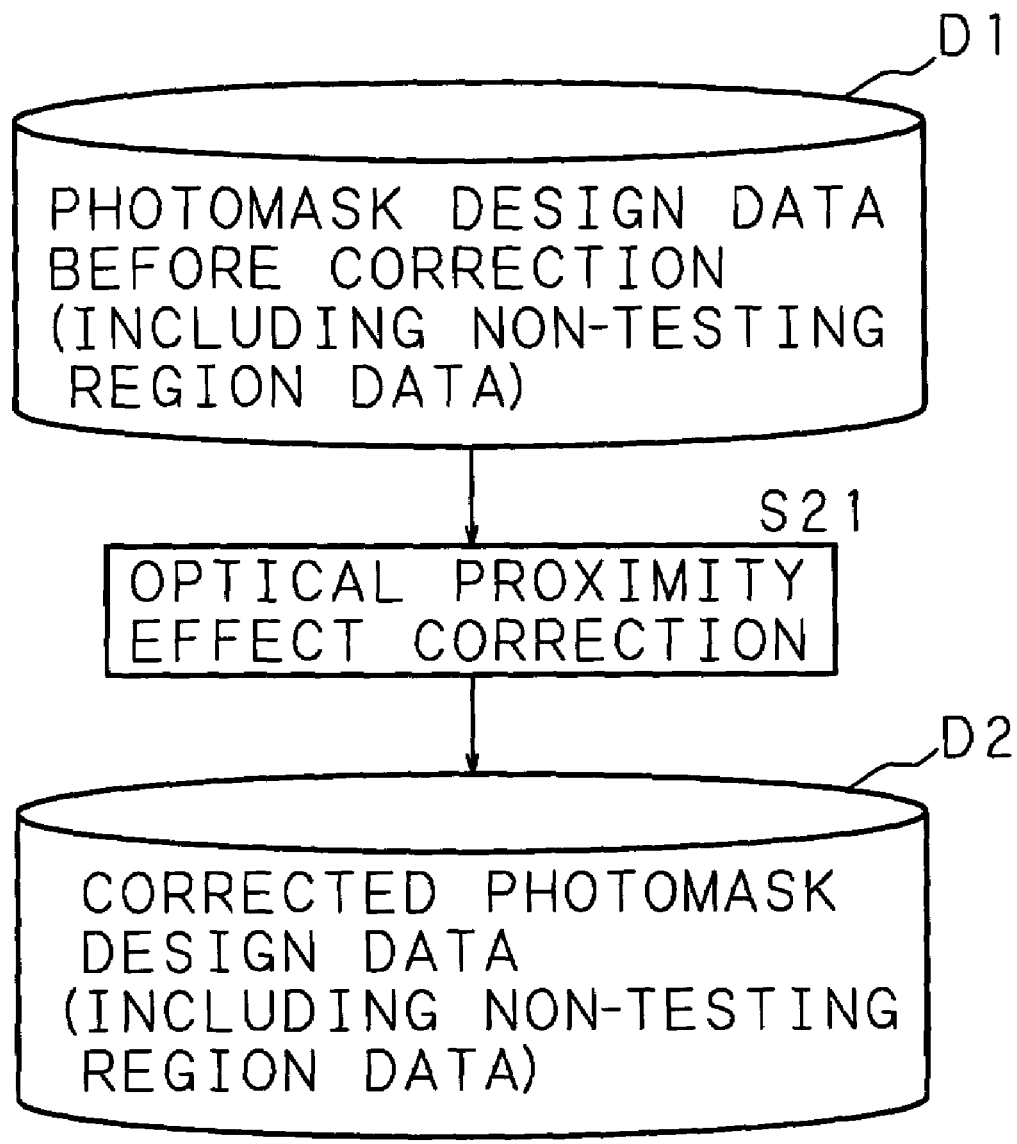
FIG. 4 is a flowchart showing still another embodiment of the photomask defect testing method in accordance with the present invention.

FIG. 4 is a flowchart showing Embodiment 3 of the photomask defect testing method in accordance with the present invention. This flowchart minutely shows another embodiment of the step (S1) in the flowchart shown in FIG. 1, wherein the optical proximity effect correction and the extraction and judgment of the non-testing region designation data are carried out. In this embodiment, the extraction and judgment of the non-testing region designation data are not carried out. Since the other steps are similar to those shown in the flowchart of FIG. 1, their explanations are omitted.

At the step (at S1 in FIG. 1) wherein the optical proximity effect correction is carried out, first, the photomask design data D1 before correction created beforehand and including non-testing region data, from which non-testing region data is excluded, is subjected to the optical proximity effect correction (at S21 in FIG. 4), whereby corrected photomask design data D2 is created and stored.

This photomask defect testing method is effective in the case when pattern portions in which a photomask testing apparatus might cause pseudo errors are specified in the data obtained after the photomask design data D1 before correction is subjected to the optical proximity effect correction (at S21). Since the extraction processing (for example, at steps S11, S12 and S13 in FIG. 2) after the optical proximity effect correction (at S21) can be omitted and processing time can be shortened.

In Embodiment 2 mentioned above, pattern portions having values that are detected as pseudo errors during photomask testing after the optical proximity effect correction are generated in the cyclic pattern region 1 and the other region 2. However, in memory devices and the like, a design with small pattern spaces is used only in the cyclic pattern portions of a memory cell because of limitations on photolithography processing. In the case of other non-cyclic random pattern portions, only sufficiently large pattern spaces are allowed in design, and design data in which pseudo errors occur obviously only in specific regions is present.

In this case, by drawing non-testing regions in the photomask design data D1 before correction beforehand according to the flowchart shown in FIG. 4, the error location extraction step after the optical proximity effect correction can be omitted, and processing time can be shortened.

Also in this case, on the basis of the corrected photomask design data D2 output finally, according to the flowchart shown in FIG. 1, the process from photomask manufacturing to photomask defect testing is carried out. Regions causing pseudo errors during testing have been specified as non-testing region data and excluded from objects to be subjected to defect testing. Therefore, the occurrence of pseudo errors during photomask defect testing can be prevented, and testing time can be shortened.

A photomask subjected to defect testing by using the above-mentioned photomask defect testing method is manufactured, and by using this manufactured photomask, semiconductor integrated circuits are manufactured.

With the photomask defect testing method in accordance with the present invention, in the photomask defect testing process carried out for a pattern obtained when a design pattern is subjected to the optical proximity effect correction, it is possible to attain a photomask defect testing method capable of preventing delay owing to the occurrence of pseudo errors and also capable of preventing reduction in defect testing accuracy.

With the photomask manufacturing method in accordance with the present invention, in the photomask defect testing process carried out for a pattern obtained when a design pattern is subjected to optical proximity effect correction, it is possible to attain a photomask manufacturing method capable of preventing delay owing to the occurrence of pseudo errors and also capable of preventing reduction in defect testing accuracy.

With the semiconductor integrated circuit manufacturing method in accordance with the present invention, in the photomask defect testing process carried out for a pattern obtained when a design pattern is subjected to optical proximity effect correction, it is possible to attain a semiconductor integrated circuit manufacturing method capable of preventing delay owing to the occurrence of pseudo errors and also capable of preventing reduction in defect testing accuracy.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A photomask defect testing method comprising the steps of:
   a first step of creating corrected photomask design data by correcting photomask design data obtained on the basis of device design so that the exposure transfer pattern according to said photomask design data becomes closer to that according to said photomask design data before correction;
   a second step of creating reference data for photomask defect testing according to said corrected photomask design data;

a third step of creating sensor data by measuring the shape of the photomask formed on the basis of said corrected photomask design data using a sensor; and a fourth step of detecting defects on said photomask by comparing said reference data with said sensor data; characterized in that said first step further comprises:

a step of extracting first non-testing region data indicating non-testing regions including pattern portions having a predetermined width or less and pattern spaces having a predetermined value or less from said photomask design data;

a step of selecting said first non-testing region data on the basis of a predetermined standard by comparing said extracted first non-testing region data with said photomask design data before correction corresponding to said non-testing regions; and a step of storing said selected first non-testing region data so as to be included in said corrected photomask design data; and said fourth step further comprises:

a step of excluding said non-testing regions on said photomask indicated by said first non-testing region data and comparing said reference data with said sensor data.

2. A photomask defect testing method of claim 1, characterized in that said photomask design data includes beforehand second non-testing region data indicating non-testing regions including pattern portions having a predetermined width or less and pattern spaces having a predetermined value or less; and said first step further comprises a step of finally creating non-testing region data by ORing said first non-testing region data with said second non-testing region data.

3. A photomask defect testing method of claim 1, wherein said predetermined width and said predetermined value are the minimum value detectable at said fourth step.

4. A photomask defect testing method comprising the steps of:

a first step of creating corrected photomask design data by correcting photomask design data obtained on the basis of device design so that the exposure transfer pattern according to said photomask design data becomes closer to that according to said photomask design data before correction;

a second step of creating reference data for photomask defect testing according to said corrected photomask design data;

a third step of creating sensor data by measuring the shape of the photomask formed on the basis of said corrected photomask design data using a sensor; and a fourth step of detecting defects on said photomask by comparing said reference data with said sensor data; characterized in that said photomask design data includes non-testing region data indicating non-testing regions including pattern portions having a predetermined width or less and pattern spaces having a predetermined value or less; and at said fourth step, said non-testing regions on said photomask, indicated by said non-testing region data, are excluded and said reference data is compared with said sensor data.

5. A photomask defect testing method of claim 4, wherein said predetermined width and said predetermined value are the minimum value detectable at said fourth step.

6. A photomask manufacturing method of manufacturing photomasks by testing photomask defects, comprising the steps of:

a first step of creating corrected photomask design data by correcting photomask design data obtained on the basis of device design so that the exposure transfer pattern according to said photomask design data becomes closer to that according to said photomask design data before correction;

a second step of creating reference data for photomask defect testing according to said corrected photomask design data;

a third step of creating sensor data by measuring the shape of the photomask formed on the basis of said corrected photomask design data using a sensor; and a fourth step of detecting defects on said photomask by comparing said reference data with said sensor data; characterized in that said first step further comprises:

a step of extracting first non-testing region data indicating non-testing regions including pattern portions having a predetermined width or less and pattern spaces having a predetermined value or less from said photomask design data;

a step of selecting said first non-testing region data on the basis of a predetermined standard by comparing said extracted first non-testing region data with said photomask design data before correction corresponding to said non-testing regions; and a step of storing said selected first non-testing region data so as to be included in said corrected photomask design data; and said fourth step further comprises:

a step of excluding said non-testing regions on said photomask indicated by said first non-testing region data and comparing said reference data with said sensor data.

7. A photomask manufacturing method of manufacturing photomasks by testing photomask defects, comprising the steps of:

a first step of creating corrected photomask design data by correcting photomask design data obtained on the basis of device design so that the exposure transfer pattern according to said photomask design data becomes closer to that according to said photomask design data before correction;

a second step of creating reference data for photomask defect testing according to said corrected photomask design data;

a third step of creating sensor data by measuring the shape of the photomask formed on the basis of said corrected photomask design data using a sensor; and a fourth step of detecting defects on said photomask by comparing said reference data with said sensor data; characterized in that said photomask design data includes non-testing region data indicating non-testing regions including pattern portions having a predetermined width or less and pattern spaces having a predetermined value or less; and at said fourth step, said non-testing regions on said photomask, indicated by said non-testing region data, are excluded and said reference data is compared with said sensor data.

8. A semiconductor integrated circuit manufacturing method of manufacturing semiconductor integrated circuits by using photomasks, comprising the steps of:

a first step of creating corrected photomask design data by correcting photomask design data obtained on the basis of device design so that the exposure transfer pattern according to said photomask design data becomes closer to that according to said photomask design data before correction;
a second step of creating reference data for photomask defect testing according to said corrected photomask design data;
a third step of creating sensor data by measuring the shape of the photomask formed on the basis of said corrected photomask design data using a sensor; and
a fourth step of detecting defects on said photomask by comparing said reference data with said sensor data;
characterized in that said first step further comprises:
a step of extracting first non-testing region data indicating non-testing regions including pattern portions having a predetermined width or less and pattern spaces having a predetermined value or less from said photomask design data;
a step of selecting said first non-testing region data on the basis of a predetermined standard by comparing said extracted first non-testing region data with said photomask design data before correction corresponding to said non-testing regions; and
a step of storing said selected first non-testing region data so as to be included in said corrected photomask design data; and
said fourth step further comprises:
a step of excluding said non-testing regions on said photomask indicated by said first non-testing region data and comparing said reference data with said sensor data.

9. A semiconductor integrated circuit manufacturing method of manufacturing semiconductor integrated circuits by using photomasks, comprising the steps of:
a first step of creating corrected photomask design data by correcting photomask design data obtained on the basis of device design so that the exposure transfer pattern according to said photomask design data becomes closer to that according to said photomask design data before correction;
a second step of creating reference data for photomask defect testing according to said corrected photomask design data;
a third step of creating sensor data by measuring the shape of the photomask formed on the basis of said corrected photomask design data using a sensor; and
a fourth step of detecting defects on said photomask by comparing said reference data with said sensor data;
characterized in that said photomask design data includes non-testing region data indicating non-testing regions including pattern portions having a predetermined width or less and pattern spaces having a predetermined value or less; and
at said fourth step, said non-testing regions on said photomask, indicated by said non-testing region data, are excluded and said reference data is compared with said sensor data.

* * * * *